(12) United States Patent
Tanzawa

(10) Patent No.: US 7,474,139 B2
(45) Date of Patent: Jan. 6, 2009

(54) SEMICONDUCTOR INTEGRATED CIRCUIT DEVICE AND FREQUENCY MODULATION DEVICE

(75) Inventor: Toru Tanzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 398 days.

(21) Appl. No.: 11/085,586

(22) Filed: Mar. 22, 2005

(65) Prior Publication Data
US 2005/0230730 A1  Oct. 20, 2005

(30) Foreign Application Priority Data
Mar. 24, 2004 (JP) ............................ 2004-087416
Jul. 12, 2004 (JP) ............................ 2004-204851

(51) Int. Cl.
*H03K 3/01* (2006.01)
(52) U.S. Cl. ...................................... 327/534; 327/535
(58) Field of Classification Search ................ 327/534, 327/535
See application file for complete search history.

(56) References Cited

U.S. PATENT DOCUMENTS 4,529,897 A * 7/1985 Suzuki et al. ................ 327/437
4,725,813 A * 2/1988 Miyada ....................... 327/374
5,994,744 A * 11/1999 Katayama et al. ........... 257/370

FOREIGN PATENT DOCUMENTS

| JP | 8-213909 | 8/1996 |
|---|---|---|
| JP | 2003-124803 | 4/2003 |
| JP | 2003-298414 | 10/2003 |
| JP | 2003-338745 | 11/2003 |
| JP | 2004-23232 | 1/2004 |

OTHER PUBLICATIONS

Hiroki Ishikuro, et al., "A Single-Chip CMOS Bluetooth Transceiver with 1.5MHz IF and Direct Modulation Transmitter", ISSCC, Digest of Technical Papers, Session 5, Wireless-Pan Transceivers, Paper 5.5, Salon 9, Feb. 10, 2003, 2 Pages.

* cited by examiner

*Primary Examiner*—Kenneth B. Wells
(74) *Attorney, Agent, or Firm*—Oblon, Spivak, McClelland, Maier & Neustadt, P.C.

(57) ABSTRACT

An N-type well region is formed in a P-type semiconductor substrate. In the N-type well region, a P-type well region is formed. The P-type well region is used as a back gate of a transistor. The back gate of the transistor is separated from other elements by the N-type well region. In the P-type well region, a pair of N+ type semiconductor regions as a source region and a drain region of the transistor is formed. On the surface of the semiconductor substrate, a gate electrode of the transistor is formed. A potential of one region among the above-described pair of N+ type semiconductor regions is inputted to a buffer circuit. The same potential as the potential of the N+ type semiconductor region to be outputted from the buffer circuit is supplied to the P-type well region via a switching element.

9 Claims, 9 Drawing Sheets

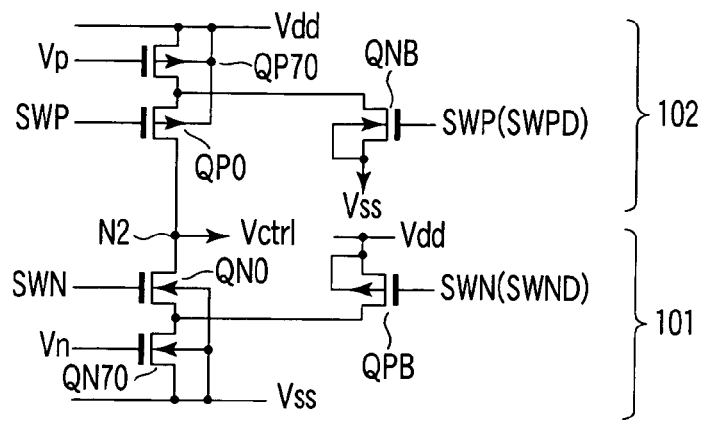
F I G. 16
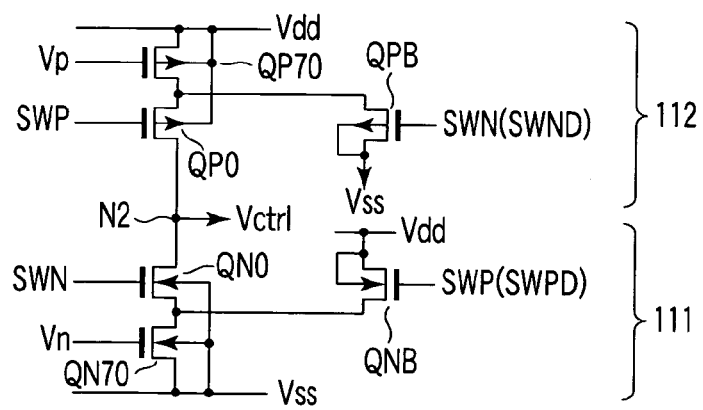
F I G. 17
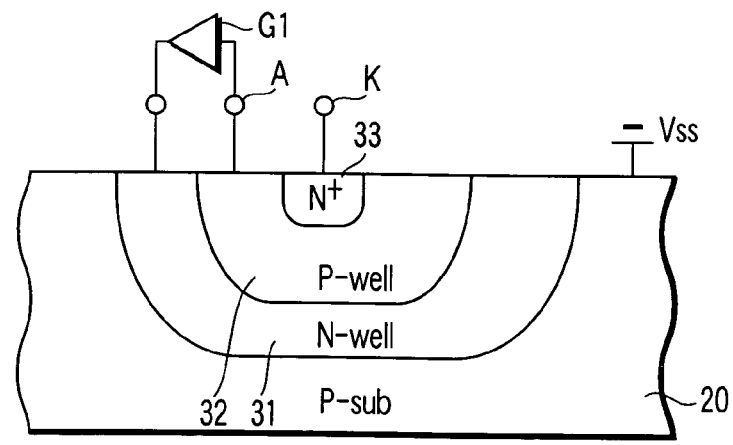
F I G. 18

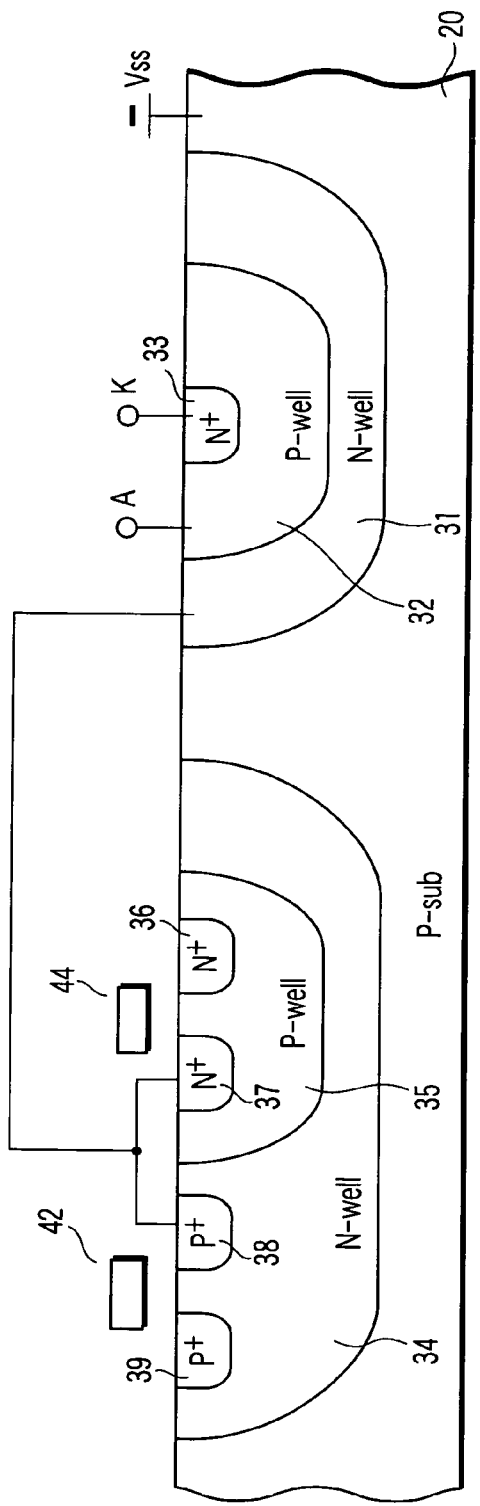
F I G. 21
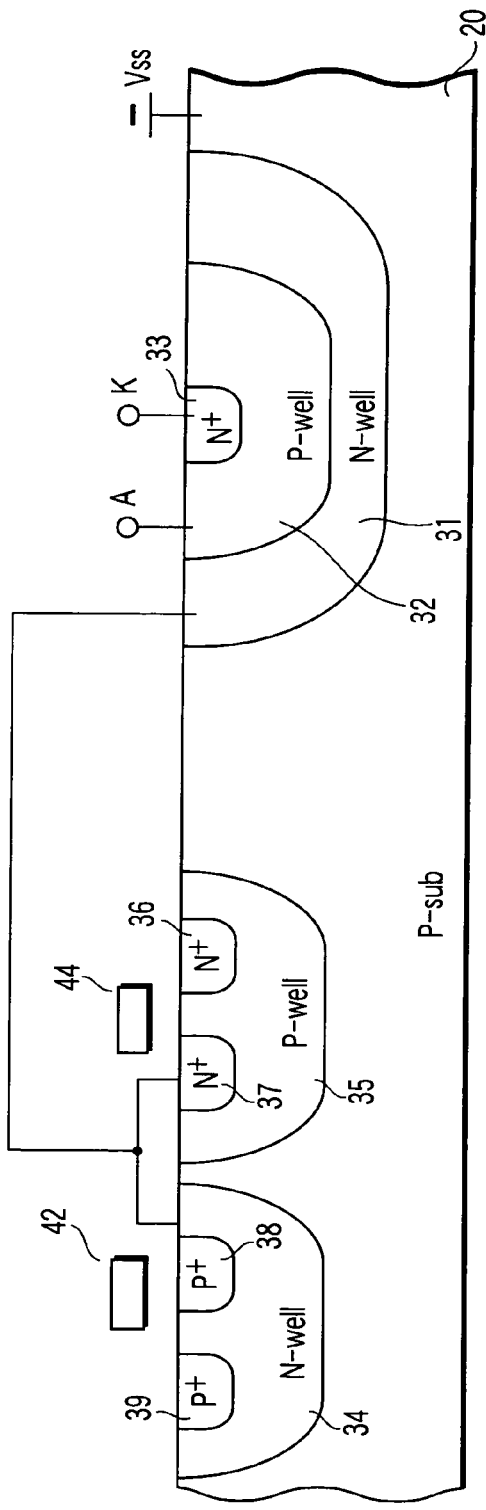
F I G. 22

SEMICONDUCTOR INTEGRATED CIRCUIT DEVICE AND FREQUENCY MODULATION DEVICE

CROSS-REFERENCE TO RELATED APPLICATIONS

This application is based upon and claims the benefit of priority from prior Japanese Patent Applications No. 2004-087416, filed Mar. 24, 2004; and No. 2004-204851, filed Jul. 12, 2004, the entire contents of both of which are incorporated herein by reference.

BACKGROUND OF THE INVENTION

1. Field of the Invention

This invention relates to semiconductor integrated circuit (LSI) device contained switch circuits and variable capacitor elements and a frequency modulation device.

2. Description of the Related Art

Bluetooth™ is proposed as a new standard of radio communications for mobile terminals in order to exchange data items between mobile telephones, personal digital assistants (PDA), notebook-sized personal computers and voice terminal devices such as headphones. In Bluetooth™, a carrier signal with a frequency of 2.4 GHz band is used and, for example, a transmission speed of 1 Mbps at maximum is realized.

In a mobile terminal (which is hereinafter referred to as a Bluetooth device) which can cope with Bluetooth™, 79 frequency channels defined in the frequency band of 2.402 GHz to 2.480 GHz are used. A frequency hopping system is used in which radio communication is performed by changing the frequency channels with time. In the frequency hopping system, channel selection is repeatedly made at preset time intervals based on a predetermined pseudo random algorithm and one packet data is allocated to one channel to perform communication.

As one example of a frequency shift key (FSK) modulation device used in the radio communication system of the frequency hopping system, for example, a device disclosed by H. ISHIKURO et al., "A Single-Chip CMOS Bluetooth Transceiver with 1.5 MHz IF and Direct Modulation Transmitter", ISSCC 2003 SESSION 5 WIRELESS-PAN TRANSCEIVERS PAPER 5.5, DIGEST OF TECHNICAL PAPERS 95 is known. In the FSK modulation device, a VCO direct modulation system is provided in which a carrier signal with a preset frequency is generated from a voltage controlled oscillator circuit (VCO) and the frequency of the carrier signal is shifted according to "1", "0" of a transmission data signal input to the VCO.

An error signal is generated by comparing the carrier signal generated from the VCO with a reference signal and control voltage which is used to control the oscillation operation of the VCO is generated by supplying the error signal to a charge pump circuit. The charge pump circuit which generates the control voltage based on the error signal is normally configured by MOS transistors.

In recent years, a leak current of the MOS transistor increases with miniaturization of the LSI element and scaling of the MOS transistor. The leak current (gate-induced drain leakage current: GIDL current) at the OFF period of the MOS transistor tends to have a high degree of dependence on the drain-substrate voltage (Vdb) with scaling of the MOS transistor. For example, as shown by the characteristic indicated by broken lines in FIG. 23, the leak current (Id) increases. Further, a leak current caused by a drain-induced barrier lowering has a high degree of dependence on the drain-source voltage (Vds).

Further, if the leak current of the MOS transistor in the charge pump circuit is large when an output node of the charge pump circuit is set in an electrically floating state, the control voltage varies with time and a frequency drift of the output signal of the VCO occurs so as to make it difficult to perform data transmission with high reliability. Incidentally, in the specification of the Bluetooth device, the maximum packet length 3 ms, the frequency shift amount of the transmission signal is ±160 kHz, for example, and the frequency drift amount of the transmission signal is ±40 kHz or less.

The problem associated with the leak current described above does not occur only in the charge pump circuit. Generally, when a leak current of a switch circuit connected to a node which is desired to be set into an electrically floating state in a preset period in the LSI is large, a problem that the node voltage will vary occurs.

In order to cope with the above problem, a capacitor element with large capacitance is connected to the node so as to suppress the potential variation to a small value even when the current leak occurs. However, since the area of the capacitor element of large capacitance is large, the chip cost rises.

Further, in the FSK modulation device of the VCO direct modulation system using the conventional switch circuit, there occurs a problem that an OFF-state leak current flows in the MOS transistor configuring the switch circuit and, as a result, a frequency variation occurs in the carrier signal generated.

In addition, the problem associated with the leak current in the node set in the floating state described above also occurs in a variable capacitor element to be formed in the LSI device in the same way.

In Jpn. Pat. Appln. KOKAI Publication No. H8-213909, the technique for performing the control operation to eliminate the difference between potentials on the input side and output side of switch means at the OFF time of the switch means.

BRIEF SUMMARY OF THE INVENTION

According to a first aspect of the present invention, there is provided a semiconductor integrated circuit device comprising: a first semiconductor region of a first conductivity type; a second semiconductor region of a second conductivity type which is formed in the first semiconductor region; and a control circuit which controls a potential of the first semiconductor region to be the same as the potential of the second semiconductor region.

According to a second aspect of the present invention, there is provided a frequency modulation device comprising: a frequency modulation device comprises: a voltage controlled oscillator circuit supplied with first and second control voltages and oscillating at a frequency depending on the voltages; a frequency dividing circuit which is supplied with an oscillation output signal of the voltage controlled oscillator circuit and divides the frequency of the oscillation output signal to output a first clock signal; a phase comparator circuit which compares phases of the first clock signal and a second clock signal for reference with each other and outputs first and second pulse signals having pulse width depending on the result of comparison; a charge pump circuit which is supplied with the first and second pulse signals and outputs a current depending on the pulse widths of the first and second pulse signals; a filter circuit which converts an output current of the charge pump circuit into voltage and supplies the thus converted voltage to the voltage controlled oscillator circuit as the first control voltage; and a Gaussian filter circuit which is supplied with a transmission data signal containing a harmonic component and supplies a modulation signal obtained by reducing the harmonic component contained in the transmission data signal to the voltage controlled oscillator circuit as the second control voltage, wherein the charge pump circuit includes: a first transistor which has a source region and a drain region comprising second and third semiconductor regions of a second conductivity type, and a gate electrode, the second and third semiconductor regions are formed in a first semiconductor region of a first conductivity type with separated, and in which a current path between the source region and the drain region is inserted between a ground potential node and a charge pump output node, and the first pulse signal is supplied to a gate electrode; a buffer circuit in which a potential of the charge pump output node is inputted and which outputs the same potential as the potential of the charge pump output node; a first switch element which is connected between the first semiconductor region and the ground potential node; a second switching element which is connected between the first semiconductor region and an output node of the buffer circuit, and which connects the first semiconductor region to the output node of the buffer circuit during at least part of a period of time during which the first transistor is set in the OFF state; a second transistor which has a source region and a drain region comprising fifth and sixth semiconductor regions of a first conductivity type, and a gate electrode, the fifth and sixth semiconductor regions are formed in a fourth semiconductor region of a second conductivity type with separated, and in which a current path between the source region and the drain region is inserted between a power supply potential node and the charge pump output node, and the second pulse signal is supplied to a gate electrode; a third switching element connected between the fourth semiconductor region and the power supply potential node; and a fourth switching element which is connected between the fourth semiconductor region and the output node of the buffer circuit, and which connects the fourth semiconductor region to the output node of the buffer circuit during at least part of a period of time during which the second transistor is set in the OFF state.

BRIEF DESCRIPTION OF THE SEVERAL VIEWS OF THE DRAWING

FIG. 16 is a circuit diagram showing one example configured by using the switch circuit shown in FIG. 12 as the charge pump circuit of FIG. 1;

FIG. 17 is a circuit diagram showing one example configured by using the switch circuit shown in FIG. 10 as the charge pump circuit of FIG. 1;

FIG. 18 is a cross sectional view of a variable capacitor shown in FIG. 2;

FIG. 21 is a circuit diagram showing an example of partial elements of a variable capacitor and an operational amplifier shown in FIG. 2;

FIG. 22 is a circuit diagram showing another example of partial elements of the variable capacitor and the operational amplifier shown in FIG. 2.

DETAILED DESCRIPTION OF THE INVENTION

Figure 1:
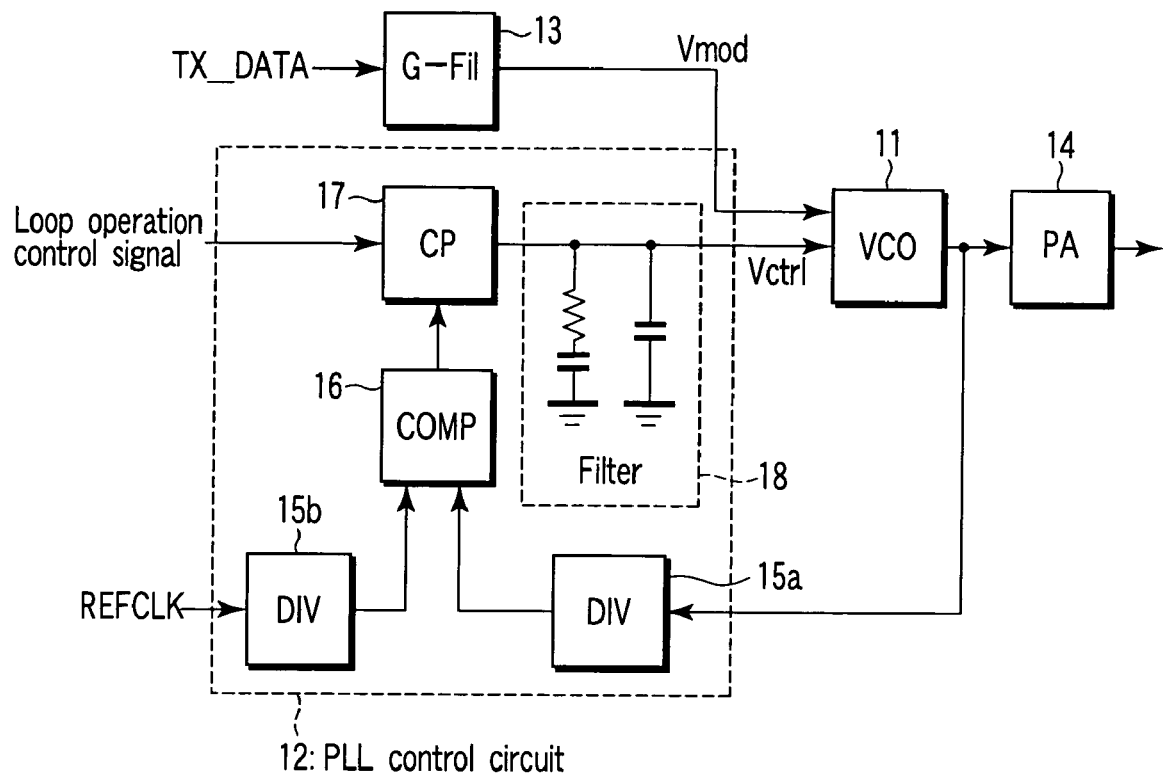
FIG. 1 is a block diagram showing one example of an FSK modulation device of a VCO direct modulation system according to a first embodiment of the present invention.

FIG. 1 is a block diagram showing the configuration of an FSK modulation device of a VCO direct modulation system according to an embodiment of the present invention. A VCO 11 is supplied with first control voltage Vctrl and second control voltage Vmod, generates a carrier signal of a frequency depending on the first control voltage Vctrl and subjects the carrier signal to FSK modulation according to the second control voltage Vmod. A PLL control circuit 12 compares the phase of a clock signal obtained by dividing the frequency of the output signal of the VCO 11 with the phase of a reference clock signal, generates a pulse signal with pulse width depending on the result of comparison, outputs a current depending on the pulse width, converts the current to voltage, and supplies the thus converted voltage to a first control voltage node of the VCO 11 as the first control voltage Vctrl. The VCO 11 and PLL control circuit 12 configure a PLL loop.

A Gaussian filter (G-Fil) circuit 13 supplies a modulation signal obtained by reducing the harmonic component of an input transmission data signal TX-DATA to the control voltage node of the VCO 11 as the second control voltage Vmod. A power amplifier (PA) circuit 14 amplifies and outputs an output signal of the VCO 11.

A frequency divider circuit (DIV) 15a is supplied with the output signal of the VCO 11. Then, the frequency divider circuit 15a divides the frequency of the output signal. A frequency divider circuit 15b divides the frequency of a reference clock signal REFCLK separately supplied thereto. A phase comparator circuit (COMP) 16 compares the phases of the clock signals output from the two frequency divider circuits 15a, 15b and generates a pulse signal with pulse width depending on the phase difference. A charge pump circuit (CP) 17 includes a switch circuit controlled by a phase difference detecting signal output from the phase comparator circuit 16 and generates a current depending on the phase difference detecting signal. A filter circuit (Filter) 18 includes a resistor element and a capacitor serially connected between a signal path and the ground node and a capacitor connected between the signal path and the ground node, converts an output current of the charge pump circuit 17 into voltage and supplies the thus converted voltage to the first control voltage node of the VCO 11 as the first control voltage Vctrl.

Figure 2:
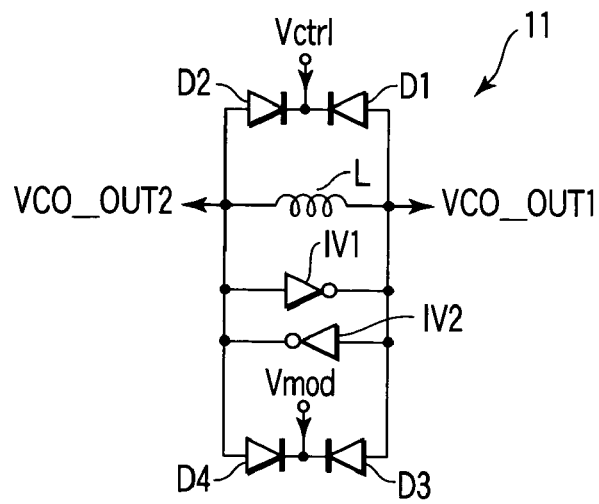
FIG. 2 is a circuit diagram showing the configuration of the VCO shown in FIG. 1.
Figure 3:
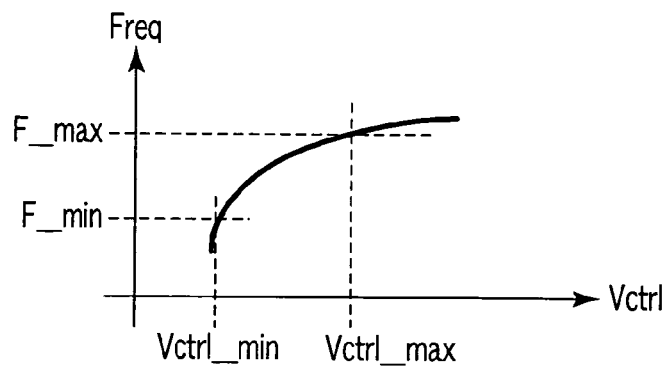
FIG. 3 is a characteristic diagram of the VCO shown in FIG. 2.

For example, the VCO 11 has a configuration as shown in FIG. 2 and has the characteristic as shown in FIG. 3. The VCO 11 has first and second output nodes for outputting differential signals VCO_OUT1, VCO_OUT2; a first inverter circuit (inverting circuit) IV1 for oscillation whose part between input and output terminals is inserted between the first and second output nodes; a second inverter circuit IV2 whose part between input and output terminals is inserted between the first and second output nodes in an opposite direction of the first inverter circuit IV1; an inductance element L which is inserted between the first and second output nodes; a first variable capacitor (variable capacitor element) D1 configured by, for example, a varactor diode having an anode and a cathode, the anode being connected to the first output node (a node for the signal VCO_OUT1) and a first control voltage (Vctrl) being supplied to the cathode; a second variable capacitor (variable capacitor element) D2 configured by, for example, a varactor diode having an anode and a cathode, the anode being connected to the second output node (a node for the signal VCO_OUT2) and the first control voltage Vctrl being supplied to the cathode; a third variable capacitor (variable capacitor element) D3 configured by, for example, a varactor diode having an anode and a cathode, the anode being connected to the first output node and a second control voltage Vmod being supplied to the cathode; and a fourth variable capacitor (variable capacitor element) D4 configured by, for example, a varactor diode having an anode and a cathode, the anode being connected to the second output node and the second control voltage Vmod being supplied to the cathode.

As shown in FIG. 3, when the first control voltage Vctrl is set at a desired value in a desired range (minimum value Vctrl_min, maximum value Vctrl_max), the output frequency Freq of the VCO 11 is controlled so as to set a desired channel in a desired frequency band width F_min to F_max. After the VCO 11 is thus controlled, the PLL loop is set in the open state and the PLL control operation is set in the OFF state, that is, in an interrupted state. After this, the second control voltage Vmod obtained by filtering the transmission data signal TX_DATA is supplied to the VCO 11 and the output signal of the VCO 11 is subjected to FSK modulation.

FIRST CONCRETE EXAMPLE OF SWITCH CIRCUIT

Figure 4:
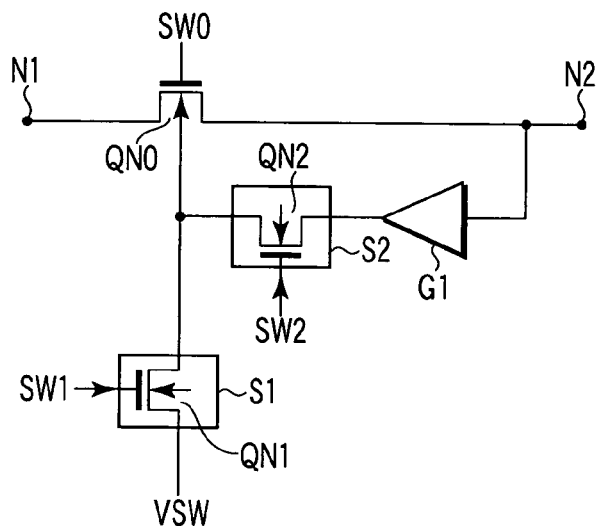
FIG. 4 is a circuit diagram showing a first concrete example of a switch circuit formed in a charge pump circuit shown in FIG. 1.

FIG. 4 is a circuit diagram showing a first concrete example of a switch circuit formed in the charge pump circuit 17 shown in FIG. 1. The switch circuit includes an NMOS transistor QN0 for switching which has a source-drain current path connected between a first node N1 and a second node N2 and switches the electrical connection state between the first node and the second node, switching elements S1, S2 which switch potential of the substrate of the transistor QN0, and a buffer circuit G1 which is supplied with potential of the second node N2 and outputs the same potential as the potential of the second node N2.

The gate of the transistor QN0 is controlled by a switch control signal SW0. The switching element S1 includes an NMOS transistor QN1 which has a source-drain current path connected between the substrate of the transistor QN0 and a well potential Vsw supply node and whose gate is controlled by a switch control signal SW1. The switching element S2 includes an NMOS transistor QN2 which has a source-drain current path connected between the substrate of the transistor QN0 and the output node of the buffer circuit G1 and whose gate is controlled by a switch control signal SW2.

Figure 5:
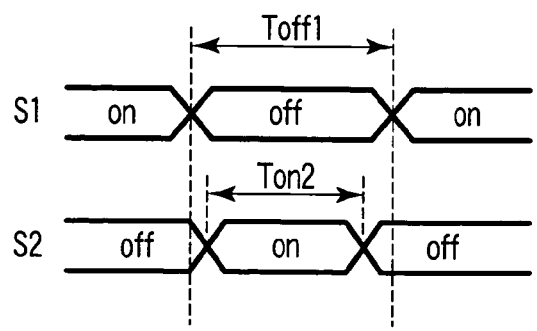
FIG. 5 is a waveform diagram showing the operation timing of the switch circuit of FIG. 4.

FIG. 5 shows the operation timing of the switch circuit of FIG. 4. In this case, Toff1 indicates an OFF period of the switching element S1 and Ton2 indicates an ON period of the switching element S2.

The switching element S2 is controlled to be set in the ON state in a period in which the switching element S1 is set in the OFF state in a period in which the transistor QN0 is set in the OFF state. During the ON state, the switching element S2 connects the substrate of the transistor QN0 to the output node of the buffer circuit G1.

The drain current Id of the NMOS transistor contains a source current Is flowing from the drain into the source and a current Ib flowing from the drain into the substrate through the PN junction. The characteristic of an OFF-state leak current of the switching transistor QN0 shown in FIG. 4 is the same as that of FIG. 23. In this case, one example of the OFF-state leak current of the conventional switching transistor is indicated by broken lines for comparison.

Figure 23:
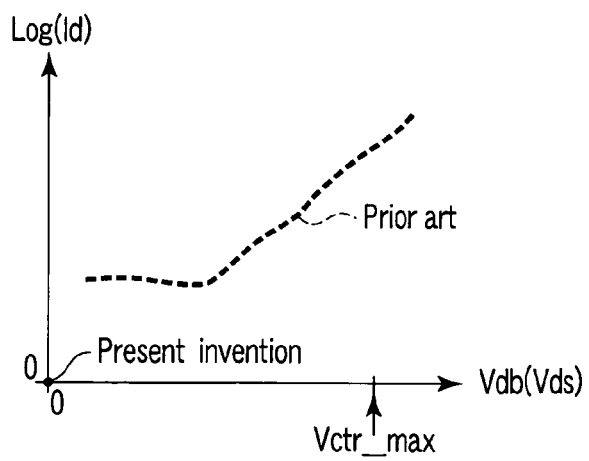
FIG. 23 is a characteristic diagram showing one example of the drain-substrate voltage dependence and drain-source voltage dependence of an OFF-state leak current of a MOS transistor.

As shown in FIG. 5, the switching element S2 is turned ON after the switching element S1 is turned OFF and then Vdb of the switching transistor QN0 is set to zero. Therefore, as shown in FIG. 23, the OFF-state leak current of the transistor QN0 can be suppressed to substantially zero. At the OFF period of the transistor QN0, a value of the OFF-state leak current caused by a potential difference applied between the second node N2 and the substrate is smaller than a value of the OFF-state leak current caused by a potential difference applied between the second node N2 and the substrate at the ON period thereof. In this case, a current flowing from the substrate of the transistor QN0 into the first node N1 is added to the consumed current, but it is considered unavoidable in order to suppress the OFF-state leak current.

Figure 6:
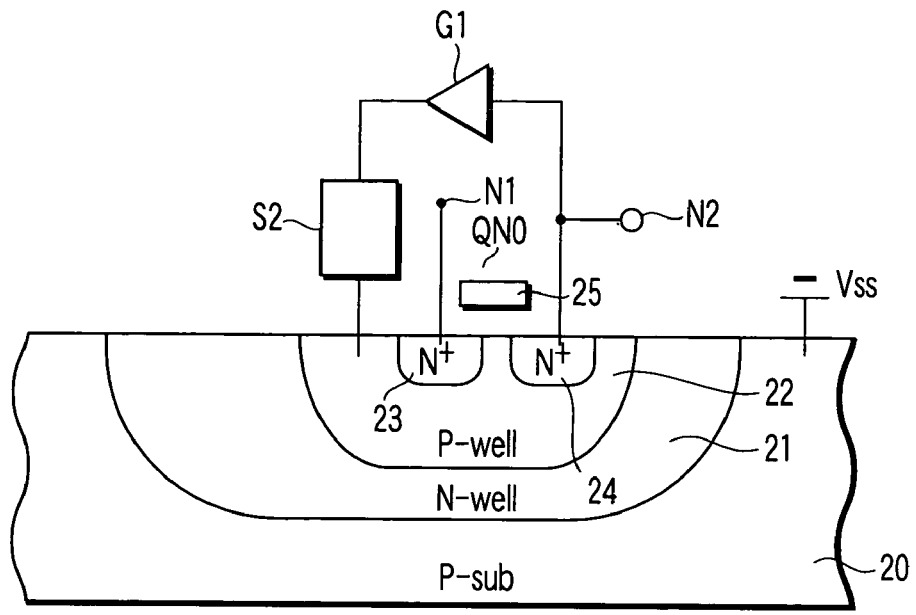
FIG. 6 is a cross sectional view of an NMOS transistor for a switch in the switch circuit shown in FIG. 4.

FIG. 6 illustrates an example of a cross sectional structure of the NMOS transistor QN0 in the switch circuit shown in FIG. 4. The transistor QN0 is integrated together with other elements in a P-type semiconductor substrate (P-sub) 20. In the semiconductor substrate 20, an N-type well region (N-well) 21 is formed, and further, in the N-type well region 21, a P-type well region (P-well) 22 is formed. The P-type well region 22 functions as a substrate (back gate) of the transistor QN0. The N-type well region 21 separates the substrate of the transistor QN0 from other elements. In the P-type well region 22, $N^+$ type semiconductor regions 23 and 24 as a source region and a drain region of the transistor QN0 are formed. Further, a gate electrode 25 of the transistor QN0 is formed on the surface of the semiconductor substrate 20.

In FIG. 6, the P-type semiconductor substrate 20 is connected to the ground potential (Vss), the $N^+$ type semiconductor region 23 is connected to the first node N1, and the $N^+$ type semiconductor region 24 is connected to the second node N2. In addition, the potential of the N+ type semiconductor region 24 is inputted to the buffer circuit G1, and the potential that is the same as the potential of the N+ type semiconductor region 24 to be outputted from the buffer circuit G1 is supplied to the P-type well region 22 via the switch element S2.

In this case, when the switch element S2 is set in the ON state during a period of time that the transistor QN0 has been turned off, the potential of the P-type well region 22 is set at the same potential as that of the N+ type semiconductor region 24. Therefore, as described above, the voltage Vdb between the drain of the transistor QN0 (the N+ type semiconductor region 24) and the substrate (the N-type well region 21) becomes zero and this enables to suppress the OFF-state leak current of the transistor QN0 almost zero.

SECOND CONCRETE EXAMPLE OF SWITCH CIRCUIT

Figure 7:
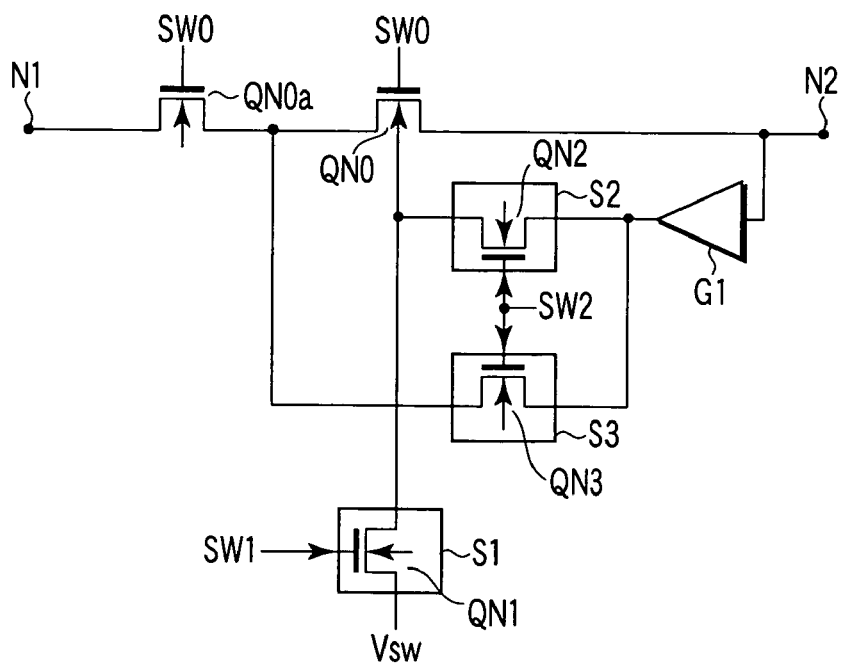
FIG. 7 is a circuit diagram showing a second concrete example of the switch circuit formed in the charge pump circuit in FIG. 1.

FIG. 7 is a circuit diagram showing a second concrete example of the switch circuit formed in the charge pump circuit 17 shown in FIG. 1. The switch circuit shown in FIG. 7 is different from the first concrete circuit example of the switch circuit explained with reference to FIG. 4 in that the source-drain current path of a different switching NMOS transistor QN0a is connected between the first node N1 and the transistor QN0 and a switching element S3 is connected to a series connection node of the two transistors QN0 and QN0a. Portions which are the same as those of FIG. 4 are denoted by the same reference symbols.

That is, the source-drain current paths of the switching transistor QN0 and transistor QN0a are serially connected between the first node N1 and the second node N2. The switching element S3 is configured by an NMOS transistor QN3 having a source-drain current path connected between the serial connection node of the two transistors QN0 and QN0a and an output node of the buffer circuit G1. Like the NMOS transistor QN2, the gate of the NMOS transistor QN3 is controlled by the switch control signal SW2. In the meantime, a cross sectional structure of the transistor QN0a for a switch is the same as in FIG. 6.

Figure 8:
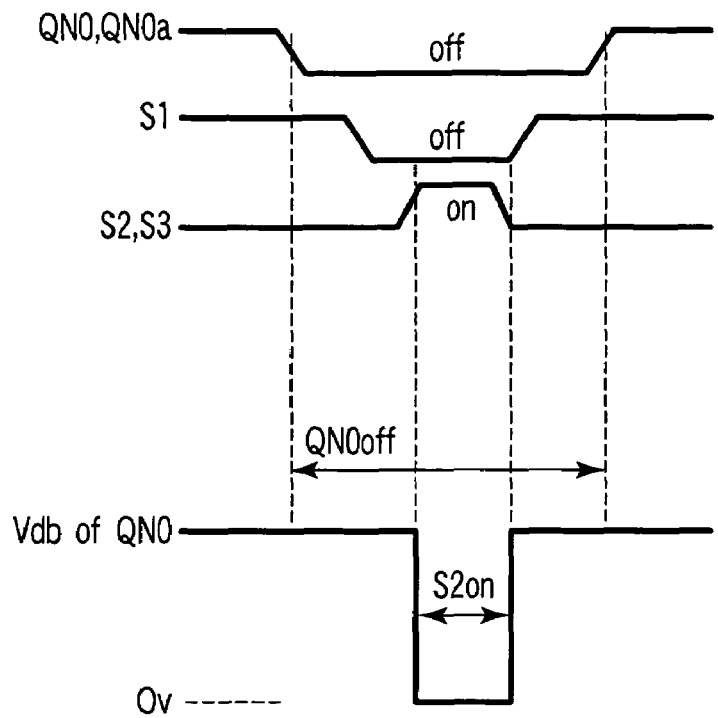
FIG. 8 is a waveform diagram showing one example of the operation timing of the switch circuit of FIG. 7.

FIG. 8 shows the operation timing of the switch circuit of FIG. 7. The switching element S3 is controlled by the switch control signal SW2 to electrically connect the series connection node of the two transistors QN0, QN0a to the output node of the buffer circuit G1 in at least part of a period in which the two transistors QN0, QN0a are set in the OFF state.

When the transistor QN0 is set in the OFF state, the relation of Vg=0 V and Vs=Vd=Vb is attained and an OFF-state leak current is not generated in principle. The transistor QN0a generates an OFF-state leak current to some extent, but the leak current does not flow out from the second node N2 but flows out from the buffer circuit G1 and the flow-out destination of the OFF-state leak current can be switched.

THIRD CONCRETE EXAMPLE OF SWITCH CIRCUIT

Figure 9:
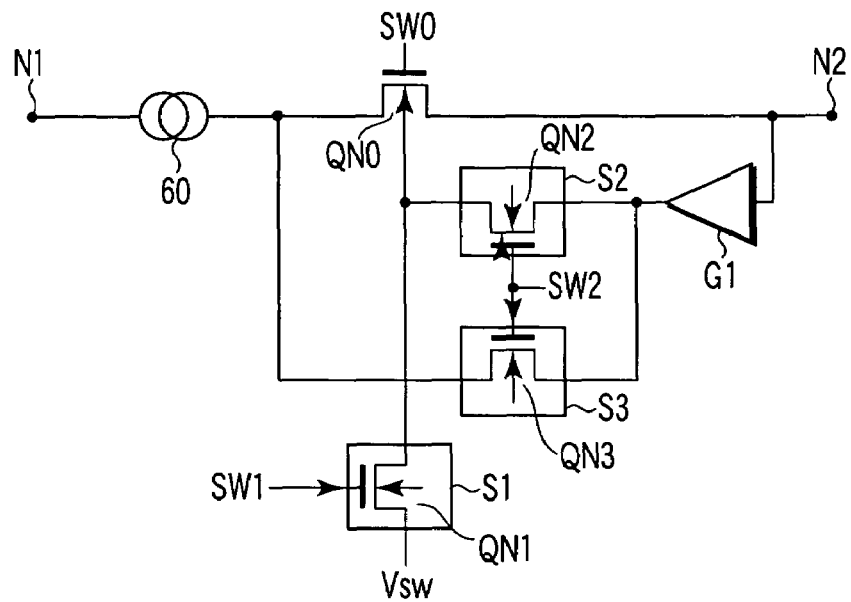
FIG. 9 is a circuit diagram showing a third concrete example of the switch circuit formed in the charge pump circuit shown in FIG. 1.

FIG. 9 is a circuit diagram showing a third concrete example of the switch circuit formed in the charge pump circuit 17 shown in FIG. 1. The switch circuit shown in FIG. 9 is different from the second concrete example of the switch circuit explained with reference to FIG. 7 in that a constant current source circuit 60 is used instead of the switching transistor QN0a. Portions which are the same as those of FIG. 7 are denoted by the same reference symbols. That is, the constant current source circuit 60 and the source-drain current path of the switching transistor QN0 are serially connected between the first node N1 and the second node N2. The serial connection node is supplied with output a bias potential of the buffer circuit G1 via the switching element S3. The switch circuit is equivalent to the switch circuit shown in FIG. 7 and the explanation of the operation thereof is omitted.

FOURTH CONCRETE EXAMPLE OF SWITCH CIRCUIT

Figure 10:
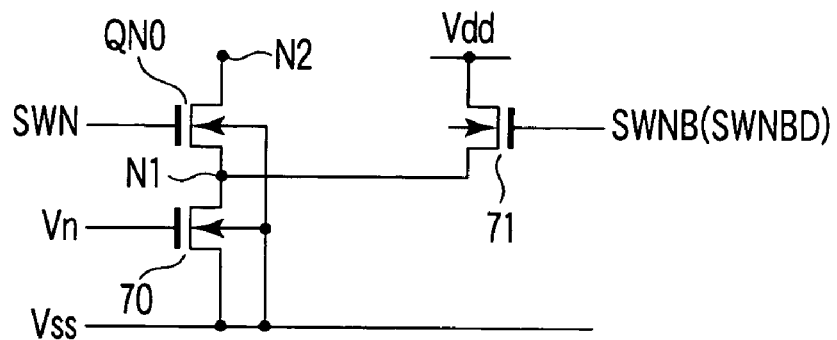
FIG. 10 is a circuit diagram showing a fourth concrete detail configuration of the switch circuit formed in the charge pump circuit shown in FIG. 1.

FIG. 10 is a circuit diagram showing a fourth concrete detail configuration of the switch circuit formed in the charge pump circuit 17 shown in FIG. 1. The source-drain current path of the switching NMOS transistor QN0 is connected between the first node N1 and the second node N2. The source-drain current path of an NMOS transistor 70 used as a current source is connected between the first node N1 and a third node (Vss node) which is set at first power supply potential (Vss in this example). In this case, the substrates of the switching transistor QN0 and the transistor 70 are connected to the Vss node. The gate of the switching transistor QN0 is supplied with a first switch control signal SWN and the gate of the transistor 70 is supplied with a bias potential Vn. Further, the source-drain current path of a biasing NMOS transistor 71 having the same conductivity type (first conductivity type) as the switching transistor QN0 is connected between a fourth node (Vdd node) which is set at second power supply potential (Vdd in this example) and a series connection node (first node N1) of the switching transistor QN0 and the transistor 70. The gate of the NMOS transistor 71 is supplied with a second switch control signal SWNB which is complementary to the first switch control signal SWN or a third signal SWNBD obtained by delaying the above control signal.

Figure 11:
FIG. 11 is a waveform diagram showing one example of the operation timing of the switch circuit of FIG. 10.

FIG. 11 shows the operation timing of the switch circuit of FIG. 10. The switch control signal SWNB supplied to the gate of the biasing NMOS transistor 71 or the signal SWNBD obtained by delaying the above control signal is set to a second logical level ("H" in this example) to control and set the biasing NMOS transistor 71 into the ON state at the same time that or when delay time Td2 ($\geq 0$) has elapsed after the switch control signal SWN is or was set to a first logical level ("L" in this example) to set the switching NMOS transistor QN0 into the OFF state. As a result, the relation of the drain and source of the switching NMOS transistor QN0 is reversed in comparison with a case where the switching NMOS transistor QN0 is set in the ON state and the relation of Vb=Vg=0 V, Vd=Vdd and Vs=Vctrl is attained. At this time, Vds=Vdd–Vctrl, but the relation of Vsb=Vsg=1 to 2V can be attained. Therefore, the gate of the switching NMOS transistor QN0 is set to effectively negative bias potential and a leak current becomes smaller. Further, the threshold voltage becomes higher by the substrate bias effect and a leak current is reduced.

The switch control signal SWNB or the signal SWNBD obtained by delaying the above control signal is set to "L" to control and set the biasing NMOS transistor 71 into the OFF state at earlier timing (earlier by time Td1$\geq 0$) with respect to the timing at which the switch control signal SWN is set to "H" to turn ON the switching NMOS transistor QN0.

Therefore, according to the switch circuit shown in FIG. 10, an OFF-state leak current can be reduced like the case of each concrete example of the switch circuit. In this case, the NMOS transistor 70 used as the current source may be replaced by a resistor element.

FIFTH CONCRETE EXAMPLE OF SWITCH CIRCUIT

Figure 12:
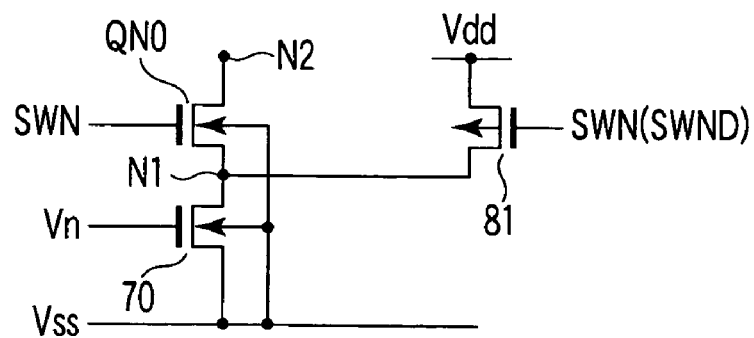
FIG. 12 is a circuit diagram showing a fifth concrete detail configuration of the switch circuit formed in the charge pump circuit shown in FIG. 1.

FIG. 12 is a circuit diagram showing a fifth concrete detail configuration of the switch circuit formed in the charge pump circuit 17 of FIG. 1. The switch circuit shown in FIG. 12 is different from the switch circuit explained with reference to FIG. 10 in that a PMOS transistor 81 of a conductivity type (second conductivity type) opposite to that of the switching NMOS transistor QN0 is connected instead of the biasing NMOS transistor 71. The gate of the PMOS transistor 81 is supplied with a first switch control signal SWN or a second signal SWND obtained by delaying the above control signal.

The operation of the switch circuit of FIG. 12 is basically the same as the operation of the switch circuit explained with reference to FIG. 11. That is, the switch control signal SWN supplied to the gate of the PMOS transistor 81 or the signal SWND obtained by delaying the above control signal is set to "L" to control and set the PMOS transistor 81 into the ON state at the same time or when delay time Td2 ($\geq 0$) has elapsed after the switch control signal SWN is or was set to "L" to set the switching NMOS transistor QN0 into the OFF state. As a result, the relation of the drain and source of the switching NMOS transistor QN0 is reversed in comparison with a case where the switching NMOS transistor QN0 is set in the ON state and the relation of Vb=Vg=0V, Vd=Vdd and Vs=Vctrl is attained. At this time, Vds=Vdd−Vctrl, but the relation of Vsb=Vsg=1 to 2V can be attained. Therefore, the gate of the switching NMOS transistor QN0 is set to effectively negative bias potential and a leak current becomes smaller. Further, the threshold voltage becomes higher by the substrate bias effect and a leak current is reduced.

Therefore, according to the switch circuit of FIG. 12, an OFF-state leak current can be reduced like the case of the switch circuit explained with reference to FIG. 10. In this case, the NMOS transistor 70 used as the current source may be replaced by a resistor element.

FIRST APPLICATION EXAMPLE OF SWITCH CIRCUIT

Figure 13:
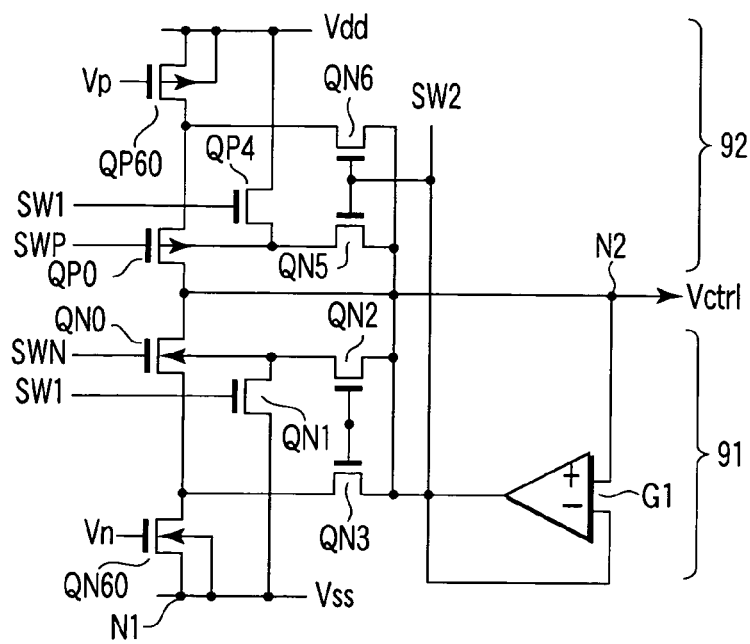
FIG. 13 is a circuit diagram showing one example configured by using the switch circuit shown in FIG. 9 as the charge pump circuit of FIG. 1.

FIG. 13 is a circuit diagram showing one example configured by using the switch circuit shown in FIG. 9 as the charge pump circuit of FIG. 1. A first switch circuit 91 is connected between a first node N1 (Vss node) and a second node N2 (output node) and a second switch circuit 92 is connected between a Vdd node and the second node N2 (output node).

In the first switch circuit 91, the source-drain current paths of an NMOS transistor QN60 used as a current source and a switching NMOS transistor QN0 are serially connected between the first node N1 (Vss node) and the second node N2 (output node). The second node N2 is connected to an input node of the buffer circuit G1 configured by an operational amplifier. The gate of the NMOS transistor QN60 is applied with bias potential Vn and the gate of the switching NMOS transistor QN0 is supplied with the switch control signal SWN. The substrate of the NMOS transistor QN60 is connected to the Vss node. The substrate of the switching NMOS transistor QN0 is connected to the Vss node via the NMOS transistor QN1 which is the switching element S1 and connected to the output node of the buffer circuit G1 via the NMOS transistor QN2 which is the switching element S2. A series connection node of the switching NMOS transistor QN0 and the NMOS transistor QN60 is connected to the output node of the buffer circuit G1 via the NMOS transistor QN3 which is the switching element S3.

In the second switch circuit 92, the source-drain current paths of a PMOS transistor QP60 used as a current source and a switching PMOS transistor QP0 are serially connected between the Vdd node and the second node N2 (output node). The gate of the PMOS transistor QP60 is applied with bias potential Vp and the gate of the switching PMOS transistor QP0 is supplied with the switch control signal SWP. The substrate of the PMOS transistor QP60 is connected to the Vdd node. The substrate of the switching PMOS transistor QP0 is connected to the Vdd node via the PMOS transistor QP4 which is the switching element S4 and connected to the output node of the buffer circuit G1 via the NMOS transistor QN5 which is the switching element S5. A series connection node of the PMOS transistor QP60 and the switching PMOS transistor QP0 is connected to the output node of the buffer circuit G1 via the NMOS transistor QN6 which is the switching element S6.

Figure 14:
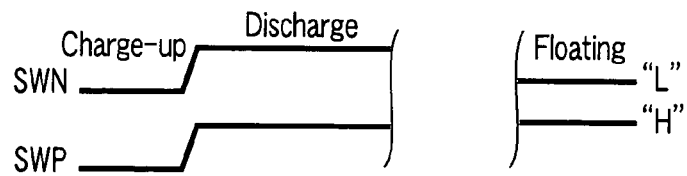
FIG. 14 is a timing waveform diagram showing a waveform example of a switch control signal used in the charge pump circuit of FIG. 13.

As switch control signals SWN, SWP supplied to the gates of the switching transistors QN0, QP0, signals as shown in FIG. 14 are used. That is, the switch control signals SWN, SWP are both set at "L" in a charge-up period, both set at "H" in a discharge period and respectively set at "L" and "H" in a floating period. As the switch control signals SWN, SWP, phase difference detection signals output from the phase comparator circuit 16 of FIG. 1 are supplied and, for example, a phase lead detection pulse signal corresponds to the switch control signal SWN and a phase lag detection pulse signal corresponds to the switch control signal SWP.

The operation of the switch circuit in the charge pump circuit shown in FIG. 13 is basically the same as the operation of the switch circuit shown in FIG. 9, and therefore, the explanation thereof is omitted and the operation of the charge pump circuit is explained below.

Assume that the switch control signals SWN, SWP are both set at "L" at the phase lead detection time. Then, the switching PMOS transistor QP0 and NMOS transistor QN0 are respectively set in the ON and OFF states to charge up the output node N2. On the other hand, when the switch control signals SWN, SWP are both set at "H" at the phase lag detection time, then the switching PMOS transistor QP0 and NMOS transistor QN0 are respectively set in the OFF and ON states to discharge the output node N2. Further, when the switch control signals SWN, SWP are set at "L"/"H" at the phase synchronization time, then the switching PMOS transistor QP0 and NMOS transistor QN0 are both set in the OFF state to set the output node N2 into an electrically floating state. The output current of the output node N2 of the charge pump circuit is converted into first control voltage Vctrl by the filter circuit 18 of FIG. 1.

In the operation of the charge pump circuit, in a period in which the switching PMOS transistor QP0 and NMOS transistor QN0 are both set in the OFF state, that is, in a period in which the loop of the PLL control circuit 12 shown in FIG. 1 is set in the OFF state, the NMOS transistors QN2, QN3, QN5, QN6 which are the switching elements are set into the ON state by the switch control signal SW2. At this time, since the source, drain and substrate of the switching PMOS transistor QP0 are set at the same potential and the source, drain and substrate of the switching NMOS transistor QN0 are set at the same potential, the leak currents flowing from the output node N2 to the Vss node and Vdd node can be suppressed to substantially zero.

As a result, in the FSK modulation device of FIG. 1, a variation in the first control voltage Vctrl can be suppressed and a carrier signal having a stable frequency can be generated.

Figure 15:
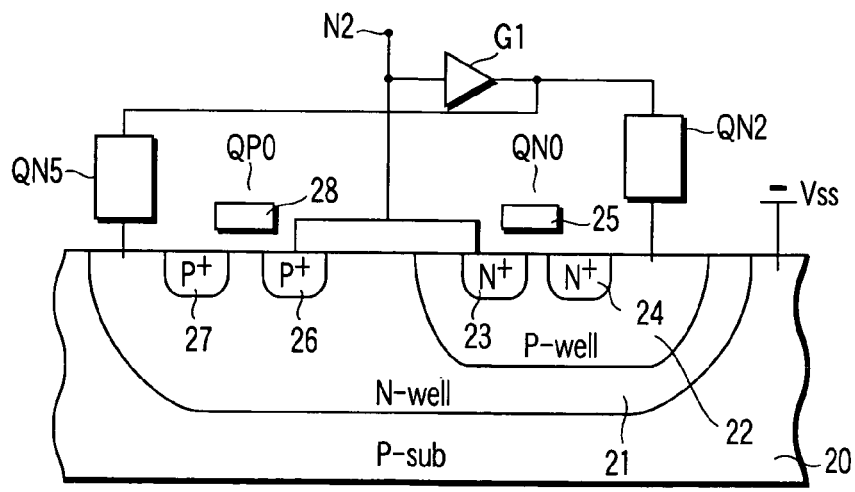
FIG. 15 is a cross sectional view of an NMOS transistor for two switches in the switch circuit shown in FIG. 13.

FIG. 15 illustrates an example of a cross sectional structure of the NMOS transistor QN0 and the PMOS transistor QP0, in the switch circuit shown in FIG. 13. The transistors QN0 and QP0 are integrated together with other elements in the P-type semiconductor substrate 20. In the semiconductor substrate 20, an N-type well region (N-well) 21 is formed, and further, in the N-type well region 21, a P-type well region (P-well) 22 is formed. The N-type well region 21 is used as a substrate (back gate) of the PMOS transistor QP0, and the P-type well region 22 is used as a substrate (back gate) of the NMOS transistor QN0. Further, the NMOS transistor QN0 and the PMOS transistor QP0 are separated from other elements by the N-type well region 21. In the P-type well region 22, the $N^+$ type semiconductor regions 23 and 24 as a source region and a drain region of the NMOS transistor QN0 are formed. Furthermore, on the surface of the semiconductor substrate 20, a gate electrode 25 of the NMOS transistor QN0 is formed. In the N-type well region 21, $P^+$ type semiconductor regions 26 and 27 as a source region and a drain region of the PMOS transistor QP0 are formed. Further, on the surface of the semiconductor substrate 20, a gate electrode 28 of the PMOS transistor QP0 is formed.

In FIG. 15, the P-type semiconductor substrate 20 is connected to the ground potential (Vss). The $N^+$ type semiconductor region 23 as the drain region of the NMOS transistor QN0 and the $P^+$ type semiconductor region 26 as the drain region of the PMOS transistor QP0 are connected to the second node N2 with each other by a wiring. The potentials of the $N^+$ type semiconductor region 23 as the drain region of the NMOS transistor QN0 and the $P^+$ type semiconductor region 26 as the drain region of the PMOS transistor QP0 are inputted to the buffer circuit G1. The buffer circuit G1 outputs a potential same as the potentials of the $N^+$ type semiconductor region 23 and the $P^+$ type semiconductor region 26. The output potential of the buffer circuit G1 is supplied to the P-type well region 22 via the NMOS transistor QN2, and is supplied to the N-type well region 21 via the NMOS transistor QN5.

SECOND APPLICATION EXAMPLE OF SWITCH CIRCUIT

FIG. 16 is a circuit diagram showing one example configured by using the switch circuit shown in FIG. 12 as the charge pump circuit 17 of FIG. 1. In the charge pump circuit shown in FIG. 16, a first switch circuit 101 is connected between a first node N1 (Vss node) and second node N2 (output node) and a second switch circuit 102 is connected between a Vdd node and the second node N2 (output node).

In the first switch circuit 101, the source-drain current paths of an NMOS transistor QN70 used as a current source and a switching NMOS transistor QN0 are serially connected between the first node N1 (Vss node) and the second node N2 (output node). The substrates of the transistors QN70 and QN0 are both connected to the Vss node. The gate of the NMOS transistor QN70 is applied with a bias potential Vn and the gate of the switching NMOS transistor QN0 is supplied with the switch control signal SWN. The source-drain current path of a PMOS transistor QPB corresponding to the biasing transistor 81 is connected between a series connection node of the two transistors QN70, QN0 and the Vdd node. The substrate of the PMOS transistor QPB is connected to the Vdd node and the gate thereof is supplied with the switch control signal SWN or a signal SWND obtained by delaying the above control signal.

On the other hand, in the second switch circuit 102, the source-drain current paths of a PMOS transistor QP70 used as a current source and a switching PMOS transistor QP0 are serially connected between the Vdd node and the second node N2 (output node). The substrates of the transistors QP70, QP0 are connected to the Vdd node. The gate of the PMOS transistor QP70 is applied with a bias potential Vp and the gate of the switching transistor QP0 is supplied with the switch control signal SWP. The source-drain current path of a biasing NMOS transistor QNB is connected between a series connection node of the two transistors QP70, QP0 and the Vss node. The substrate of the transistor QNB is connected to the Vss node and the gate thereof is supplied with the switch control signal SWP or a signal SWPD obtained by delaying the above control signal. The switch control signals SWN, SWP are the same as the signals explained with reference to FIG. 14.

The operation of the switch circuit shown in FIG. 16 is basically the same as that of the switch circuit shown in FIG. 12, and therefore, the explanation thereof is omitted and the operation of the charge pump circuit of FIG. 16 is explained below.

When the switch control signals SWN, SWP are both set at "L", the switching PMOS transistor QP0 and NMOS transistor QN0 are respectively set in the ON and OFF states to charge up the output node N2. On the other hand, when the switch control signals SWN, SWP are both set at "H", the switching PMOS transistor QP0 and NMOS transistor QN0 are respectively set in the OFF and ON states to discharge the output node N2. When the switch control signals SWN, SWP are respectively set at "L"/"H" at the phase synchronization time, the switching PMOS transistor QP0 and NMOS transistor QN0 are both set in the OFF state to set the output node N2 into an electrically floating state. The output current of the output node N2 of the charge pump circuit is converted into first control voltage Vctrl by the filter circuit 18 of FIG. 1.

In the operation of the charge pump circuit, in a period in which the switching PMOS transistor QP0 and NMOS transistor QN0 are both set in the OFF state, that is, in a period in which the loop of the PLL control circuit 12 shown in FIG. 1 is set in the OFF state, the biasing PMOS transistor QPB and NMOS transistor QNB are set into the ON state by the switch control signal SWN (or SWND) and switch control signal SWP (or SWPD). At this time, since the gates of the switching NMOS transistor QN0 and PMOS transistor QP0 are set at effectively negative bias potential, the leak currents flowing from the output node N2 to the Vss node and Vdd node can be suppressed to substantially zero. As a result, in the FSK modulation device of FIG. 1, a variation in the first control voltage Vctrl can be suppressed and a carrier signal having a stable frequency can be generated.

THIRD APPLICATION EXAMPLE OF SWITCH CIRCUIT

FIG. 17 is a circuit diagram showing one example configured by using the switch circuit shown in FIG. 10 as the charge pump circuit 17 of FIG. 1. The charge pump circuit shown in FIG. 17 includes two switch circuits 111, 112. The switch circuits 111, 112 are similar to the switch circuits 101, 102 in the charge pump circuit explained with reference to FIG. 16 except the following points and the other portions are substantially the same. Therefore, portions which are the same as those of FIG. 16 are denoted by the same reference symbols. That is, in the switch circuit 111, the NMOS transistor QNB is used instead of the biasing PMOS transistor QPB of the switch circuit 101 of FIG. 16. The substrate of the transistor QNB is connected to the Vdd node and the gate thereof is supplied with the switch control signal SWP or a signal SWPD obtained by delaying the above control signal. In the switch circuit 112, the PMOS transistor QPB is used instead of the biasing NMOS transistor QNB of the switch circuit 102 of FIG. 16. The substrate of the transistor QPB is connected to the Vss node and the gate thereof is supplied with the switch control signal SWN or a signal SWND obtained by delaying the above control signal.

The operation of the charge pump circuit shown in FIG. 17 is basically the same as that of the charge pump circuit explained with reference to FIG. 16, and therefore, the explanation thereof is omitted. In the third application example, the same effect as that of the second application example can be attained.

FIRST CONCRETE EXAMPLE OF VARIABLE CAPACITOR

Figure 19:
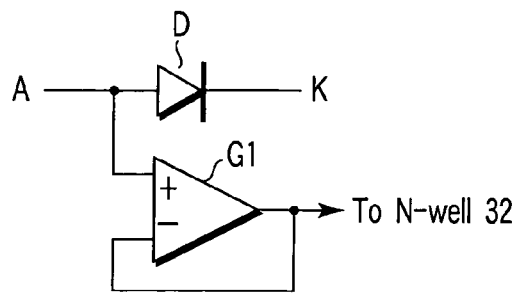
FIG. 19 is an equivalent circuit diagram of FIG. 18.

FIG. 18 illustrates an example of any one cross sectional structure from among first to fourth variable capacitors (variable capacitor elements) D1 to D4 that are disposed in the VCO 11 shown in FIG. 2. In addition, FIG. 19 illustrates an equivalent circuit of FIG. 18. As shown in FIG. 19, the buffer circuit G1 is configured by using an operational amplifier of which inverting input terminal (−) and output terminal are short-circuited.

The variable capacitor is integrated with other elements in the semiconductor substrate (P-sub) 20. In the semiconductor substrate 20, an N-type well region (N-well) 31 is formed, and further, in the N-type well region 31, a P-type well region (P-well) 32 is formed. The P-type well region 32 is used as an anode region A of the variable capacitor. The anode region A of the variable capacitor is separated from other elements by the N-type well region 31. In the P-type well region 32, an N+ type semiconductor region 33 as a cathode region K of the variable capacitor is formed.

In FIG. 18, the P-type semiconductor substrate 20 is connected to the ground potential (Vss), the P-type well region 32 is connected to the first output node or the second output node of the VCO 11, and the N+ type semiconductor region 33 is connected to the first control voltage node or the second control voltage node.

In addition, the potential of the P-type well region 32 is inputted to the buffer circuit G1, and the same potential as the potential of the P-type well region 32 to be outputted from the buffer circuit G1 is supplied to the N-type well region 31.

As shown in FIG. 18, the variable capacitor uses a PN junction of the PN junction diode. The P-type well region 32 as the anode region of the variable capacitor is surrounded by the N-type well region 31. Since the junction area of the P-type well region 32 and the N-type well region 31 is large, a junction leak current between the both regions is relatively large. The junction leak current between the regions is proportional to a width of a depletion layer occurring on a boundary face of the regions. When a depletion layer occurs on the boundary face of both the above-described regions, appear and disappear current that appears and disappears in the depletion layer is always generated and its current amount is proportional to the width of the depletion layer. Generally, an inverse direction bias is applied between the above-described regions. When the inverse direction bias is applied, a depletion layer is generated on the boundary face of the regions and a leak current is generated by the appearance and disappearance current.

In addition, the N+ type semiconductor region 33 as the cathode region of the variable capacitor may be set in a floating state upon the operation of the VCO 11. When the N+ type semiconductor region 33 is set in the floating state, the leak current occurring between the P-type well region 32 and the N-type well region 31 has an adverse affect on a charge retention property of the capacitor element. Further, it generates a frequency drift in the output signal of the VCO 11 in FIG. 1.

According to the variable capacitor shown in FIG. 18, the same potential as the potential of the P-type well region 32 to be outputted from the buffer circuit G1 is supplied to the N-type well region 31. Thereby, since no potential difference occurs between the P-type well region 32 and the N-type well region 31, it is possible to minimize the width of the depletion layer occurring on the boundary face of the P-type well region 32 and the N-type well region 31. In other words, it is possible to minimize the current amount of the leak current flowing between the P-type well region 32 and the N-type well region 31, and the charge retention property after making the N+ type semiconductor region 33 into a floating state can be improved.

Figure 20:
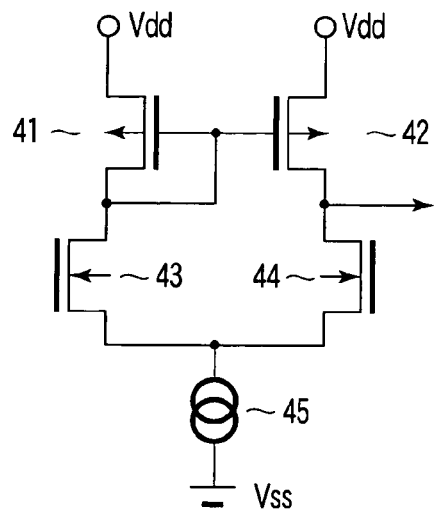
FIG. 20 is a circuit diagram showing an example of an operational amplifier configuring a buffer circuit shown in FIGS. 18 and 19.

FIG. 20 illustrates an example of a circuit structure of an operational amplifier constructing the buffer circuit G1 in FIGS. 18 and 19. This operational amplifier includes two PMOS transistors 41 and 42 for load constructing a current mirror circuit, two NMOS transistors 43 and 44 for driving, and a current source 45. The operational amplifier of such a configuration can be integrated in the same substrate as the substrate where the variable capacitor shown in FIG. 18 is formed.

FIG. 21 illustrates an example of a cross sectional structure of partial elements of the variable capacitors (D1 to D4) and the operational amplifier. Since the cross sectional structure of the variable capacitor is the same as that of FIG. 18, its explanation is herein omitted.

An N-type well region (N-well) 34 is formed in the P-type semiconductor substrate (P-sub) 20, and further, a P-type well region (P-well) 35 is formed in the N-type well region (N-well) 34. In the P-type well region 35, N+ type semiconductor regions 36 and 37 as a source region and a drain region of the NMOS transistor 44 are formed with separated each other. In addition, a gate electrode of the NMOS transistor 44 is formed on the semiconductor substrate 20. In the N-type well region 34, P+ type semiconductor regions 38 and 39 as a source region and a drain region of the PMOS transistor 42 are formed with separated each other. A gate electrode of the PMOS transistor 42 is formed on the semiconductor substrate 20.

The N+ type semiconductor region 37 as the drain region of the NMOS transistor 44 and the P+ type semiconductor region 38 as the drain region of the PMOS transistor 42 are connected each other to be an output node of the buffer circuit G1. This output node is connected to the N-type well region 31 of the variable capacitor.

FIG. 22 illustrates another example of the cross sectional structure of partial elements of the variable capacitors (D1 to D4) and the operational amplifier. In FIG. 21, the case that the P-type well region 35 is formed in the N-type well region 34 is illustrated. On the contrary, in FIG. 22, the P-type well region 35 is formed in the P-type semiconductor substrate 20, and the N-type well region 34 as the substrate (back gate) of the PMOS transistor 42 is formed in the P-type semiconductor substrate 20.

Also in the variable capacitors shown in FIGS. 21 and 22, it is possible to minimize the current amount of the leak current flowing between the P-type well region 32 and the N-type well region 31, and the charge retention property after making the N+ type semiconductor region 33 into a floating state can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a first semiconductor region of a first conductivity type;
a second semiconductor region of a second conductivity type which is formed in the first semiconductor region;
a buffer circuit in which the potential of the second semiconductor region is inputted and which outputs the same potential as the potential of the second semiconductor region;
a first switching element connected between the first semiconductor region and a first node to which a first DC potential is supplied; and
a second switching element connected between an output node of the buffer circuit and the first semiconductor region, and being set in the ON state during at least part of a period of time during which the first switching element is set in the OFF state.

2. The semiconductor integrated circuit device according to claim 1, wherein the first semiconductor region is a well region which is a substrate of a first transistor, and the second semiconductor region is one region of a source region and a drain region of the first transistor.

3. The semiconductor integrated circuit device according to claim 2, further comprising:
a third semiconductor region of the second conductivity type, which is formed in the first semiconductor region separated from the second semiconductor region, and is the other region of a source region and a drain region of the first transistor; and
a third switching element connected between the output node of the buffer circuit and the third semiconductor region, and which connects the output node of the buffer circuit to the third semiconductor region during at least part of a period of time during which the first transistor is set in the OFF state.

4. The semiconductor integrated circuit device according to claim 1, wherein the first switching element is set in the ON state when the first transistor is set in the ON state,
the second switching element is set in the ON state when the first transistor is set in the OFF state,
a timing when the first switching element is set in the OFF state is faster than a timing when the second switching element is set in the ON state, and
a timing when the second switching element is set in the OFF state is faster than a timing when the first switching element is set in the ON state.

5. The semiconductor integrated circuit device according to claim 3, wherein the first switching element is set in the ON state when the first transistor is set in the ON state,
the second switching element and the third switching element are turned on, respectively, when the first transistor is set in the OFF state, a timing when the first switching element is set in the OFF state is faster than a timing when the second switching element and the third switching element are turned on, and
a timing when the second switching element and the third switching element are turned off is faster than a timing when the first switching element is set in the ON state.

6. The semiconductor integrated circuit device according to claim 3, further comprising:
a second transistor which is inserted between the third semiconductor region and a second node to which a second DC potential is supplied.

7. The semiconductor integrated circuit device according to claim 3, further comprising:
a current source which is inserted between the third semiconductor region and a second node to which a third DC potential is supplied.

8. The semiconductor integrated circuit device according to claim 1, wherein the second semiconductor region is one region of an anode region and a cathode region of a variable capacitor element, and the first semiconductor region is a well region which separates the variable capacitor element from any other elements.

9. The semiconductor integrated circuit device according to claim 8, further comprising:
a third semiconductor region which is formed in the second semiconductor region, and is the other region of the anode region and the cathode region of the variable capacitor element.

* * * * *